United States Patent
Kiehl et al.

[11] Patent Number: 5,444,398
[45] Date of Patent: Aug. 22, 1995

[54] DECODED-SOURCE SENSE AMPLIFIER WITH SPECIAL COLUMN SELECT DRIVER VOLTAGE

[75] Inventors: Oliver Kiehl, Munich, Germany; Fergal Bonner, Dublin, Ireland; Michael Killian, Burlington; Klaus J. Lau, Essex Junction, both of Vt.

[73] Assignee: Siemens Aktiengesellschaft, Munich, Germany

[21] Appl. No.: 995,639

[22] Filed: Dec. 17, 1992

[51] Int. Cl.[6] ............................................. H03K 3/45
[52] U.S. Cl. .................................... 327/55; 327/51; 327/170; 327/387; 327/389; 327/398; 327/399; 327/374; 327/376
[58] Field of Search ............... 307/263, 443, 530, 542, 307/546, 572; 365/204, 189.07, 230.06; 326/17, 21, 29, 33; 327/51, 52, 55, 56, 170, 310, 312, 313, 374, 376, 379, 381, 387, 389, 391, 392, 398, 399

[56] References Cited

U.S. PATENT DOCUMENTS

| | | | |
|---|---|---|---|
| 4,731,553 | 3/1988 | Van Lehn et al. | 307/579 |
| 4,779,013 | 10/1988 | Tanaka | 307/451 |
| 4,829,199 | 5/1989 | Prater | 307/596 |
| 5,036,232 | 7/1991 | Jungert et al. | 307/542 |
| 5,063,308 | 11/1991 | Borkar | 307/572 |
| 5,065,048 | 11/1991 | Asai et al. | 307/546 |
| 5,065,361 | 11/1991 | Yoshizawa | 365/230.06 |
| 5,121,013 | 6/1992 | Chuang et al. | 307/572 |
| 5,272,670 | 12/1993 | Hashimoto | 365/195 |

OTHER PUBLICATIONS

Okamura et al., "Decoded-Source Sense Amplifier for High-Density DRAM's", *IEEE Journal*, D-State Circuits, vol. 25, No. 1, Feb., 1990, p. 18, IEEE Log. No. 8932961.

"Principles of CMOS VLSI design" by Neil H. E. Weste and Kamran Eshraghian, published by Addison-Wesley Publishing Company, Reading Massachusetts, 1985; pp. 203-224.

*Primary Examiner*—Terry D. Cunningham
*Attorney, Agent, or Firm*—Adel A. Ahmed

[57] ABSTRACT

A decoded source sense amplifier in which the column select signal is shaped so that it turns on bit select transistors at a predetermined time after the source electrodes of the sense amplifier are connected to ground, so as to give the sense amplifier time to latch before it is coupled to external bit lines.

5 Claims, 3 Drawing Sheets

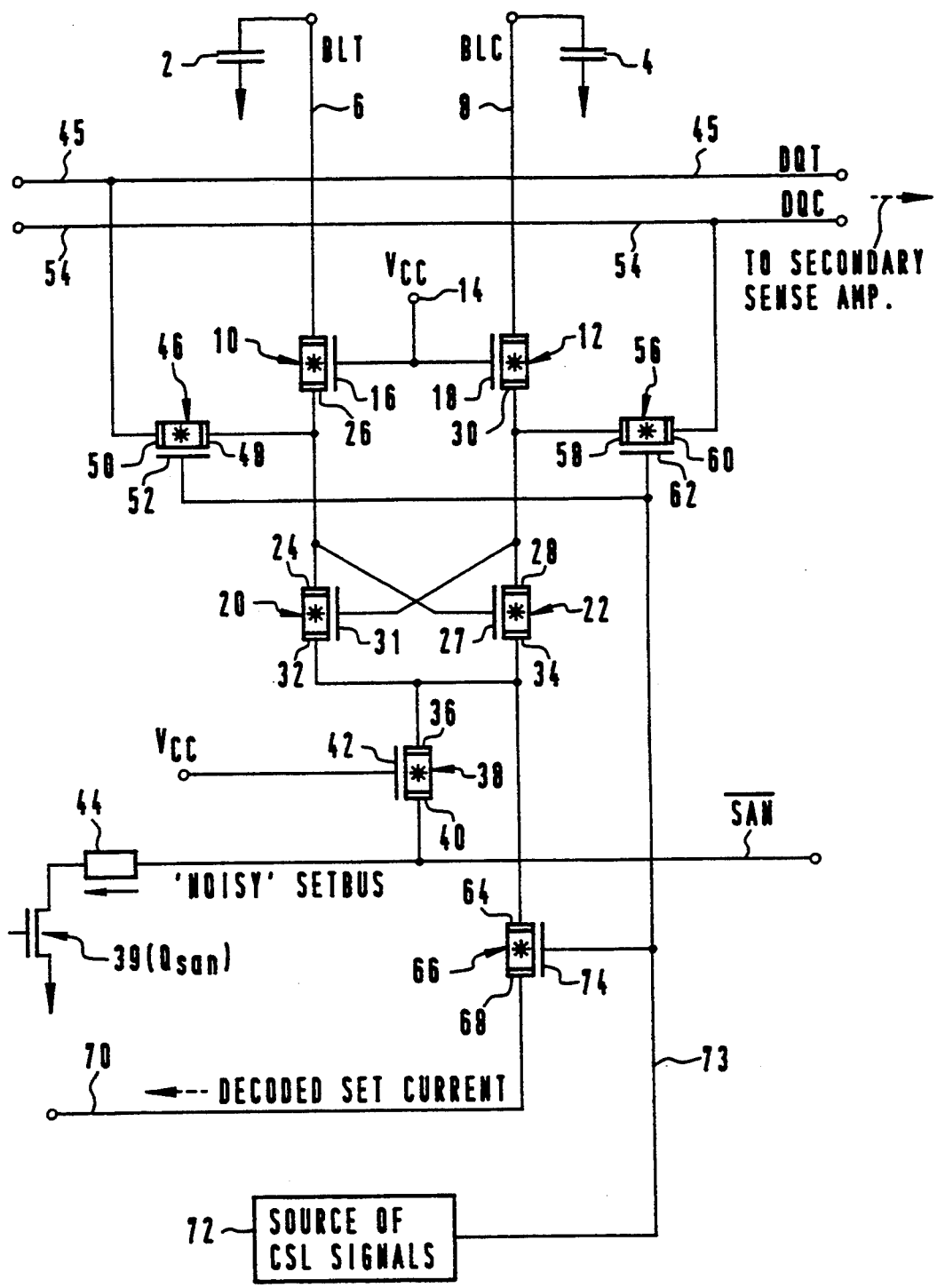

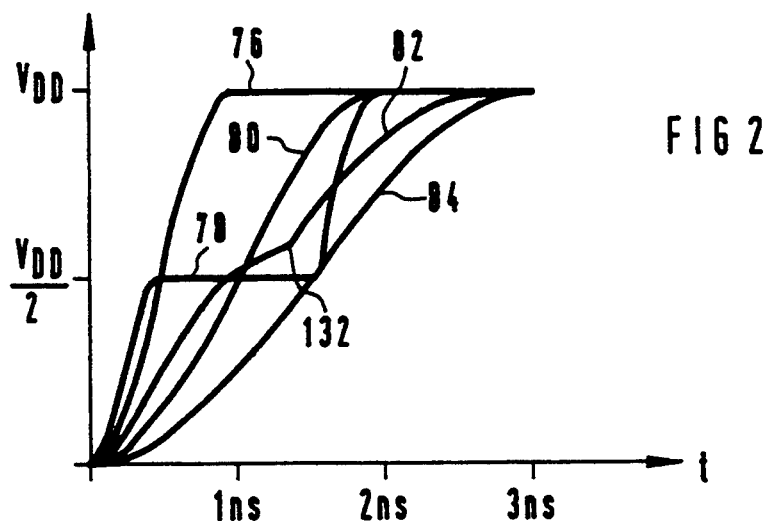
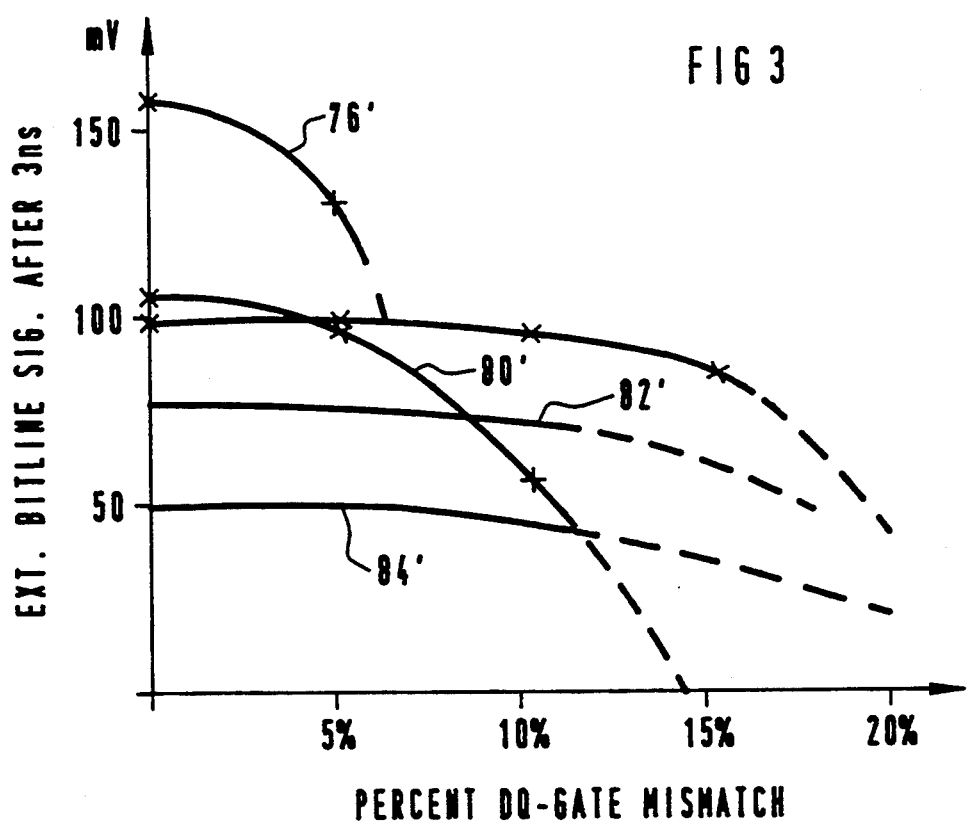

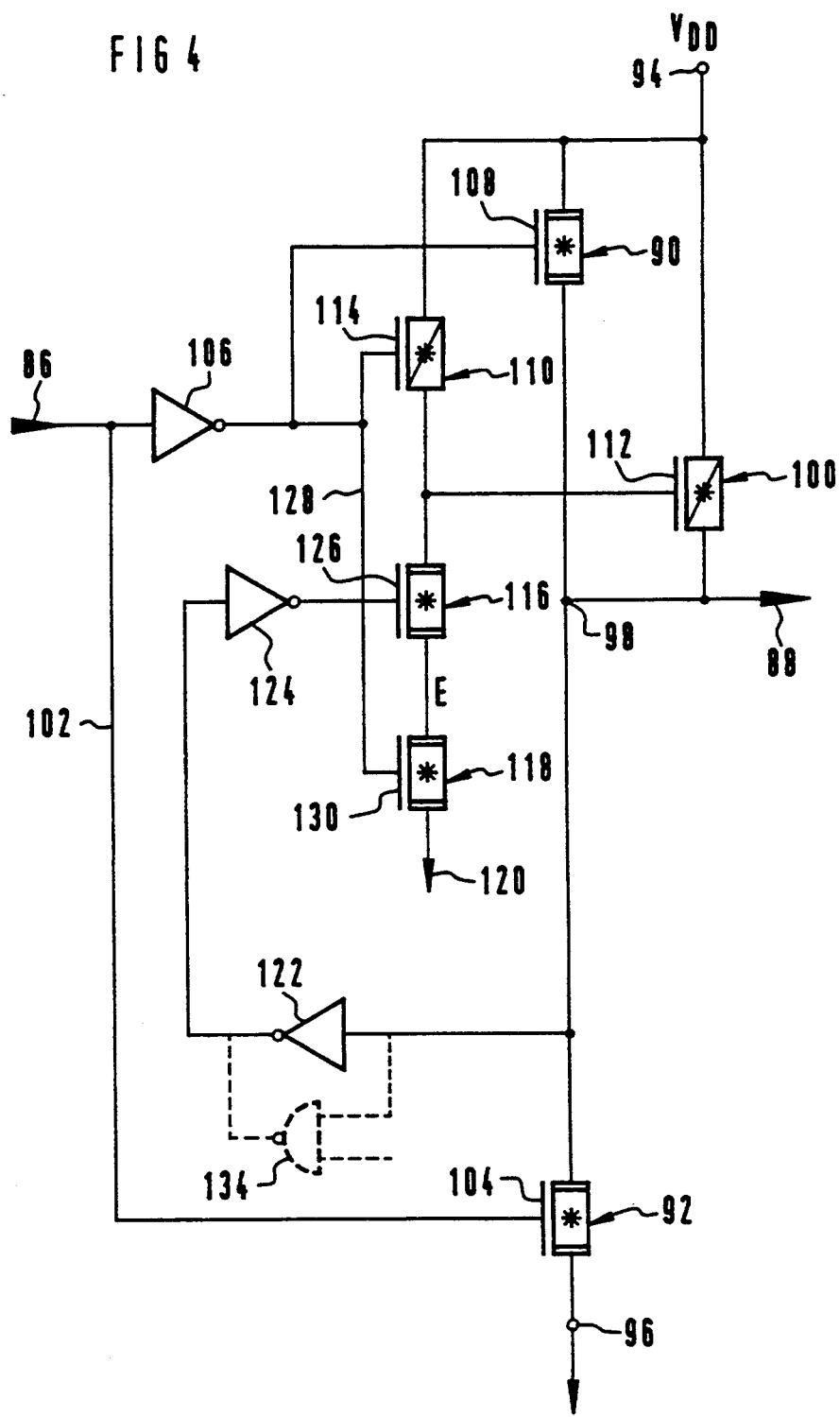

DECODED-SOURCE SENSE AMPLIFIER WITH SPECIAL COLUMN SELECT DRIVER VOLTAGE

FIELD OF THE INVENTION

This invention generally relates to decoded-source sense amplifiers (DSSA) for a dynamic random access memory (DRAM), and more particularly to methods and circuits for driving a DSSA to sense data bits.

BACKGROUND OF THE INVENTION

Reference is made to an article by Okamura et al., at page 18 in the February 1990, Volume 25, No. 1 issue of the IEEE Journal of Solid State Circuits entitled "Decoded-Source Sense Amplifier for High-Density DRAM's", for a description of a sensing amplifier system of which the present invention is an improvement. The teachings of this article are incorporated herein by reference. Such an amplifier is hereinafter referred to as DSSA and is illustrated by way of example in FIG. 1 herein. Its purpose is to produce signals in a pair of lines having a voltage differential indicative of whether the voltage on a data storage capacitor associated with one of the said lines represents a digital 0 or a digital 1. Each DSSA senses one of typically 256 or more cells arranged in a single column of a memory.

FIG. 1, which illustrates the DSSA of the above article, includes data storage capacitors 2 and 4 which are connected to bit lines 6 and 8, respectively through select transistors 46 and 56. Only an N channel sense amplifier is shown (typically including NMOS transistors) in the interest of simplicity, but as is known by those skilled in the art, P channel circuitry is typically also required. During a writing process, not described, the capacitors 2 and 4 are charged to voltages representing logic 1 or logic 0 relative to the voltage between lines 6 and 8. Field effect transistors (FET's) 10 and 12 are connected with their source/drain paths in series with the bit lines 6 and 8, respectively, and a voltage $V_{cc}$ from a point 14 is applied to their commonly connected gate electrodes 16 and 18, for providing isolating resistances relative to respective bit lines 6, 8. Cross-coupled FET's 20 and 22 (providing an N-channel flip flop) are connected with their source/drain paths respectively in series with the source/drain paths of the FET's 10 and 12. A drain electrode 24 of the FET 20 is connected to a source electrode 26 of the transistor 10 and to a gate electrode 27 of the FET 22. A drain electrode 28 of the FET 22 is connected to a source electrode 30 of the FET 12 and to a gate electrode 31 of the FET 20. Source electrodes 32 and 34 of the FET's 20 and 22, respectively, are connected to a drain electrode 36 of a FET 38, and its source electrode 40 is connected to a bus $\overline{SAN}$ (sense amplifier driving node). A gate electrode 42 of the FET 38 is connected to a source of voltage $V_{cc}$ so that the resulting impedance of the channel of FET 38 becomes a barrier or isolating resistive impedance. A FET 39 ($Q_{san}$ in the above article) is connected with its channel or main current path between the bus $\overline{SAN}$ and ground VSS. A resistor 44 represents the distributed resistance of the bus $\overline{SAN}$. Many other cells like that just described are coupled to the bus $\overline{SAN}$ in the same manner.

When actuated in a manner to be described, the flip flop 20, 22 assumes a state depending on the voltage stored on the selected capacitor, 2 or 4, in this example. The voltage at the drain electrode 24 of the FET 20 is coupled to an external bit line 45 via the channel of a FET 46 having a source electrode 48, and a drain electrode 50. A gate electrode 52 of FET 46 is connected to a source of CSL (column select line) signals 72. The voltage at the drain electrode 28 of the FET 22 is coupled to an external bit line 54 via the channel of a FET 56 having a source electrode 58, and a drain electrode 60. A gate electrode 62 of FET 56 is connected to the source of CSL signals 72.

The drain electrode 64 of a FET 66 is connected to the source electrodes 32 and 34 of the FET's 20 and 22, and its source electrode 68 is connected to a point 70 that is at a decoded ground potential DSETN. This decoded ground DSETN differs from that to which the switch 39 ($Q_{san}$) is connected in that it is an isolated source of reference potential having much less noise associated therewith.

In a high density DRAM, many more cells are read (restored) than are brought out to off chip drivers. Each storage cell which is read is connected to a DSSA which is activated as described in the above-referenced article. The bit lines 6 and 8 are precharged to a voltage Vdd/2, and the external bit lines 45 and 54 are precharged to a voltage near Vdd. Methods and apparatus for accomplishing the precharging of bit lines 6, 8, 45, and 54 are known in the art. The DSSAs which are sensing cells which are only to be restored are activated by the SAN signal which moves from a Vdd/2 precharge voltage to ground through the turning on of FET 39. When the storage cell information is to be brought to an off-chip-driver, a column selection signal CSL is applied by CSL signal source 72 to a lead 73 connected to a gate electrode 74 of the FET 66 for that cell, and to the gate electrodes 52, 62 of the FET's 46 and 56.

The sense amplifier system DSSA just described attains an advantage over the conventional system by use of the FET's 66 and 38 which allow the DSSA's containing data which are to be driven off-chip (those selected by a CSL signal) to be set faster by use of a 'clean ground'. When made conductive by application of the column select signal CSL to its gate electrode 74, FET 66 connects the source electrodes 32 and 34 of FET's 20 and 22 to the "quiet" decoded ground DSETN at terminal 70, causing FET's 20 and 22 to become firmly and quickly latched. The majority of DSSA's, which are sensing data not read out to off chip drivers, will all set at a slower rate through the "noisy" setbus which is pulled low via FET 39.

FET 38 is of help in the case of weak columns because their weaker preamplified current causes less voltage drop across the impedance of their FET corresponding to FET 38 than the greater preamplified currents of a normal cell. Weak column action is discussed in the above-referenced article.

In order to maximize the speed of the transfer of information from the bit lines 6 and 8 to the external bit lines 45 and 54, the CSL signal supplied by the source 72 rises rapidly from decoded ground DSETN to $V_{DD}$ as indicated by the graph line 76 of FIG. 2. Operation is satisfactory as long as the FET's 46 and 56 are nearly perfectly matched, but the signals developed on the external bit lines 45 and 54 are unreliable if the FET's 46 and 56 are not closely matched.

SUMMARY OF THE INVENTION

Applicants have found that the signal on the external bit lines 45 and 54 of the DSSA is reliable even when the FET's 46 and 56 that serve as bit select transistors are mismatched by as much as 15%, if the FET's 46 and 56 are made conductive after the cross coupled sense amplifiers 20 and 22 have firmly latched. This is accomplished by designing the source 72 of the CSL signal to produce a signal having a waveform that first rises to a plateau of sufficient voltage to turn on the FET 66 but insufficient to turn on the FET's 46 and 56, and then rises above the plateau to a voltage sufficient to turn on the FET's 46 and 56, in this example.

The invention also includes a circuit for producing the desired CSL signal.

BRIEF DESCRIPTION OF THE DRAWINGS

FIG. 1 is a schematic representation of a DSSA amplifier of the prior art;

FIG. 2 includes graphs representing various forms of a CSL signals, including signals for one embodiment of the invention;

FIG. 3 includes graphs respectively showing the signals developed on external bit lines for 3ns after the CSL signal starts to rise for different mismatches of the bit select transistors; and FIG. 4 is a schematic representation of a circuit for producing a CSL signal having a plateau in its mid-region, for one embodiment of the invention.

DETAILED DESCRIPTION OF PREFERRED EMBODIMENTS OF THE INVENTION

Attention is now given to the graphs 78, 80, 82, and 84 of FIG. 2 representing examples of CSL signals that may be used in accordance with this invention.

In general the slope of the CSL signal must be small enough to allow for significant amplification by the sensing amplifiers 20 and 22 before the bit select FET's 46 and 56 turn on. The time for amplification occurs between the time the CSL signal reaches the threshold voltage VTN of an N type device, at which point the FET 66 turns on, and the time when the CSL rises to a voltage ($V_{DD}/2+VTN$) at which the bit select FET's 46 and 56 turn on, in this example.

The graph 78 of FIG. 2 illustrates an ideal CSL signal which is a double step waveform with a plateau at about mid level; i.e. in the first step CSL rises to a level where the FET 66 turns on but the bit select FET's 46 and 56 are not turned on. After some delay, indicated by a plateau, the CSL signal, increases to ($V_{DD}/2+VTN$) at which the FET's 46 and 56 turn on to conduct current through their respective channels. From this point CSL increases to $V_{DD}$, in this example.

Graphs 80 and 84 indicate waveforms of CSL signals that may be used. Even though they do not have a horizontal section or plateau there is a region during which the FET 66 is turned on, and the FET's 46 and 56 are turned off until a later time. As with waveform 78, waveforms 80 and 84 turn on FET 66 when their respective amplitude exceeds VTN, and turn on FET's 46 and 56 when their respective amplitude exceeds ($V_{DD}/2+VTN$).

The graph 82 illustrates the waveform of a CSL signal generated by the CSL driver of FIG. 4 in a manner to be described.

Reference is made to the graphs of FIG. 3 illustrating the output signal respectively produced between the external bit lines 45 and 54, for different values of mismatch between the bit select transistors or FETS 46 and 56, when the CSL waveforms 76, 78, 80 and 82 of FIG. 2 are used. A graph in FIG. 3 resulting from the use of a particular waveform of FIG. 2 is designated by the number of the waveform in FIG. 2 primed. During the solid line portions of the waveforms 76', 78', 80', 82', and 84' of FIG. 3, the voltage sensed between the external bit lines 44 and 54 are considered to be useable for sensing the data of the associated DSSA. During the dashed or broken line extensions thereof, the sensed voltages are not useable. Thus, when the CSL waveform 76 of the prior art is used, the sensed voltage between the external bit lines 45 and 54 is shown by the graph 76'. It falls off rapidly with mismatch and becomes unusable at a mismatch of about 5% between FETS 46 and 56.

If the idealized CSL waveform 78 is used, the waveform 78' is seen to be at a lower voltage than 76' since the bit select FET's 46 and 56 are switched on at a later time. However, it falls only slightly in voltage amplitude until it becomes unusable at a mismatch of about 15% between FET's 46 and 56.

Using the waveform 82 that is produced by the circuit of FIG. 4 results in the second voltage waveform 82' between the external bit lines 45 and 54 starting at a lower voltage amplitude and falling off only slightly until it becomes unusable at about a 12% mismatch. This is significantly better than the results attained by the prior art CSL waveform 76. The CSL waveforms 80 and 84 result in the sensed voltage waveforms 80' and 84'.

A circuit for generating a CSL signal like that of waveform 82 of FIG. 2 is illustrated in FIG. 4. When a CSL timing or select signal applied to an input terminal 86 goes low or to digital "0", the desired CSL signal is produced at an output terminal 88, as will be described. An NMOS pull-up FET 90 is connected with its channel in series with the channel of an NMOS FET 92 between a terminal 94 at the potential $V_{DD}$, and a terminal 96 connected to a reference potential. The junction 98 of FETS 90 and 92 is connected to the output terminal 88. A PMOS pull-up FET 100 is connected with its channel between the terminal 94 and the output terminal 88.

The circuit of FIG. 4 also includes a PMOS FET 110 having a drain electrode connected to terminal 94, and a source electrode connected in common to the gate electrode 112 of PMOS FET 100 and the drain electrode of NMOS FET 116. The source electrode of NMOS FET 116 is connected to the drain electrode of an NMOS FET 118. The source electrode of NMOS FET 118 is connected to a source of reference potential 120, ground in this example. The gate electrodes of PMOS FET 11C and NMOS FET 118 are connected in common to the gate electrode 108 of NMOS FET 90, and the output terminal of inverter 106. The gate electrode 126 of NMOS FET 116 is connected to an output terminal of an inverter 124. An input terminal of inverter 124 is connected to an output terminal of another inverter 122. The input terminal of inverter 122 is connected to the common connection or node 98 between FETS 90, 92, 100, and output terminal 88. Input terminal 86 is connected in common with an input terminal of inverter 106, and the gate electrode 104 of NMOS FET 92.

The operation of the circuit of FIG. 4 will now be described in detail. When a CSL timing or select signal line connected to input terminal 86 is high, or at a digital "1" NMOS FET 92 is turned on, causing in this example a source of reference potential, ground in this example, to be applied to output terminal 88 and the input terminal of inverter 122. Inverter 122 responds by producing a high level output signal, in turn causing the output signal from inverter 124 to be low or at digital "0". This causes NMOS FET 116 to be turned off. Also, the high level signal at input terminal 86 is responded to by inverter 106 for producing a low level output signal at the gate electrodes 108, 114, and 130 of NMOS FET 90, PMOS FET 119, and NMOS FET 118, respectively. This causes NMOS FET 90 to be turned off, PMOS FET 110 to be turned on for applying $V_{DD}$ to gate 112 of PMOS FET 100, causing the latter to be turned off. Also, NMOS FET 118 is turned off. Accordingly, whenever the select signal at input terminal 86 remains high, output terminal 88 will remain connected to ground, in this example.

When the select signal or select signal line goes low or to digital "0", inverter 106 responds by producing a high level or digital "1" output signal, causing NMOS FET 90 to turn on, at a time shortly after NMOS FET 92 turns off in response to the select signal line going low. As a result, the output voltage at output terminal 88 begins to rise toward $V_{DD}/2$ as shown in FIG. 2 for waveform 82. Note that inverter 106 provides a delay time for insuring that NMOS FET 92 turns off before NMOS FET 90 turns on. The high level output signal from inverter 106 also causes PMOS FET 110 to turn off and NMOS FET 118 to turn on for connecting ground in this example to the source electrode of NMOS FET 116. However, NMOS FET 116 remains turned off due to the delay time provided by inverters 122 and 124 in responding to node 98 going high. More specifically, when NMOS FET 92 turns off, inverter 122 responds by producing a low level output signal after a predetermined delay time, to which inverter 124 responds after a predetermined delay time for producing a high level output signal at the gate 126 of NMOS transistor 116, for turning on the latter to apply a low level or digital "0" signal to the gate electrode 112 of PMOS transistor 100, causing the latter to turn on after about 1.3 ns of the select line going low, in this example. With further reference to waveform 82 of FIG. 2, this causes the transition in the slope of waveform 82 at inflection point 132, whereby the slope of the CSL waveform 82 substantially increases and the amplitude increases towards $V_{DD}$ from a voltage amplitude at 132 that is slightly greater than $V_{DD}/2$ at this time. In this manner, the CSL output waveform 82 is produced at output terminal 88. The shape and timing of waveform 82 can be changed within a range by adjusting the delay provided by inverters 122 and 124, or by adding additional inverters in series with inverters 122 and 124 to provide even greater delay. Note that by adjusting the delay provided by inverters 122 and 124, in this example, the inflection point 132 can within a range be changed as to time of occurrence and associated amplitude. In this example, after about 3 ns, the select line at input terminal 86 typically goes high, causing the circuit of FIG. 4 to respond as previously described, for turning on NMOS FET 92 for applying ground to output terminal 88, in this example.

In some situations, such as when a "fast page mode" of operation is desired when all DSSA sense amplifiers have been set and neither the weak column problem nor the DQ gate mismatch problem (associated with FETS 46 and 56) are present, it would be desirable to turn off the delay so that the PMOS pull-up FET 100 will be turned on substantially immediately after the NMOS pull-up FET 90 is turned on. This requires a fast rising CSL. Such operation can be effected by substituting a NAND gate 134, as shown in phantom in FIG. 4, for the inverter 122. One input of the NAND gate 134 would be connected to the junction 98, and a control potential could be applied to the other input. The delay of the NAND gate 134 takes the place of the delay of the inverter 122.

Although various embodiments of the present invention have been shown and described herein, they are not meant to be limiting. For example, those of skill in the art may recognize certain modifications to these embodiments, which modifications are meant to be covered by the spirit and scope of the appended claims. For example, in certain applications bipolar transistors may be substitutable for the field effect transistors shown herein.

What is claimed is:

1. Apparatus for reading or sensing voltages applied to BLT and BLC complementary bit lines via the sensing of these voltages on external DQT and DQC bit line conductors, respectively, whereby prior to sensing said BLT and BLC bit lines are precharged to a first dc voltage level, and said DQT and DQC bit lines are precharged to a second dc voltage level greater than said first dc voltage level said apparatus comprising:

a sensing amplifier having a cross-coupled pair of transistors, said transistors each having first and second output electrodes between which a main current path is formed, said second output electrodes being connected together;
means for respectively coupling said first output electrodes to said bit lines;
a pair of external DQT and DQC bit line conductors;
first and second bit line select transistors respectively connected between each of said first output electrodes and said DQT and DQC bit line conductors, each of said first and second bit line select transistors having a control electrode;
a sense amplifier driving node;
a source of reference potential;
means for coupling said sense amplifier driving node to said source of reference potential;
an impedance connected between said second output electrodes and said sense amplifier driving node;
a source of decoded ground potential;
a column decoding transistor including a main current path coupled between said second output electrodes and said source of decoded ground potential, said column decoding transistor having a control electrode; and
means for supplying a column select signal (CSL) to said control electrodes of said column decoding transistor and said bit line select transistors, said CSL signal having a plateau in its midsection such that said column decoding transistor is rendered conductive on one side of said plateau, overcoming said first precharge voltage said BLT and BLC bit lines, and said bit line select transistors are rendered conductive on the other side of said plateau, overcoming said second precharge voltage on said DQT and DQC bit lines, while maintaining conduction of said column decoding transistor;
wherein said means for supplying a column select signal to said control electrodes includes:
an input terminal for receiving a select signal;
an output terminal;
a source of operating potential;
a source of reference potential;

first and second transistors of a first conductivity type each having respective main current paths connected in series between said sources of operating and reference potential, with a common connection between their respective main current paths being connected to said output terminal, said transistors each having a control electrode;

a first transistor of a second conductivity type having a main current path connected between said source of operating potential and said output terminal, said transistor of a second conductivity type having a control electrode;

a second transistor of said second conductivity type, and third and fourth transistors of said first conductivity type each having respective main current paths connected in series in the order named between said source of operating potential and said source of reference potential, said second transistor of said second conductivity type, and said third and fourth transistors of said first conductivity type each having a control electrode;

a first inverter having an input terminal connected to said input terminal for receiving said select signal, and an output terminal connected to said control electrodes of said first transistor of said first conductivity type, said second transistor of said second conductivity type and said fourth transistor of said first conductivity type;

a connection between said input terminal and said control electrode of said second transistor of said first conductivity type;

delay means connected between said output terminal and said control electrode of said third transistor of first conductivity type; and the main current paths of said second transistor of said second conductivity type, and said third transistor of said first conductivity type, being connected in common to said control electrode of said first transistor of said second conductivity type, whereby said first transistor of said first conductivity type pulls said output terminal up to a fraction of said operating potential when said select signal at a low value of voltage is applied to said input terminal, and said first transistor of said second conductivity type turns on to pull said output terminal to said operating potential after the delay introduced by said delay means.

2. In combination:

a decoded source sense amplifier (DDSA) having a CSL terminal for the application of a column select signal (CSL);

means for supplying a column select signal to said terminal, said column select signal having a plateau in its mid section;

wherein said means for supplying a column select signal to said terminal includes:

an input terminal for the reception of a select signal;

an output terminal connected to said CSL terminal;

a source of operating potential;

a source of reference potential;

first and second NMOS transistors having respective main current paths connected in series between said sources of operating and reference potential, said first and second NMOS transistors having gate electrodes, and the common connection between said main current paths being connected to said output terminal;

a first PMOS transistor connected between said source of operating potential and said output terminal, said first PMOS transistor having a gate electrode;

a second PMOS transistor and third and fourth NMOS transistors having respective main current paths connected in series in the order named between said source of operating potential and said source of reference potential, said second PMOS transistor and said third and fourth NMOS transistors each having gate electrodes;

a first inverter connected between said input terminal and the gate electrodes of said first NMOS transistor, said second PMOS transistor, and said first fourth NMOS transistor;

a connection between said input terminal and the gate electrode of said second NMOS transistor;

delay means connected between said output terminal and said gate electrode of said third NMOS transistor; and a connection between the junction of channels of said second PMOS transistor and said third NMOS transistor and said gate electrode of said first PMOS transistor, whereby said first NMOS transistor turns on to pull said output terminal up to a fraction of said operating potential when said select signal having a low value of voltage representing a digital "0" is applied to said input terminal, and said first PMOS transistor turns on to pull said output terminal to said operating potential after a delay introduced by said delay means in applying a control signal to the gate electrode of said first PMOS transistor.

3. A circuit for producing a column select signal, comprising:

a select terminal;

an output terminal;

a source of operating potential;

a source of reference potential;

a first transistor of a first conductivity type having a main current path connected between said source of operating potential and said output terminal, said first transistor having a control electrode;

a first pull-up transistor of a second conductivity type having a main current path connected between said source of operating potential and said output terminal, said first pull-up transistor also including a control electrode;

a second transistor of second conductivity type including a main current path connected between said output terminal and said source of reference potential, said second transistor of second conductivity type also having a control electrode connected to said select terminal;

a second transistor of first conductivity type including a main current path connected between said source of operating potential and said control electrode of said first transistor of first conductivity type, said second transistor of first conductivity type having a control electrode;

third and fourth transistors of second conductivity type having respective main current paths connected in series in the order named between the control electrode of said first transistor of first conductivity type and said source of reference potential;

a first inverter having an input connected to said input terminal, and an output terminal connected in common to control electrodes of said first and fourth transistors of second conductivity type and said second transistor of first conductivity type; and delay means connected between said output terminal and the control electrode of said third transistor of second conductivity type, whereby said output terminal is at said reference potential when said select terminal is at a digital "1" level, and when this level is changed to a digital "0", said first transistor of first conductivity type turns on after turn on of said first transistor of second conductivity type by a delay time interval determined by said delay means.

4. A circuit as set forth in claim 3, wherein said delay means includes at least one inverter.

5. A circuit as set forth in claim 3, wherein said delay means includes an inverter and a NAND gate.

* * * * *